United States Patent
Smith, Jr.

(10) Patent No.: US 6,777,996 B2
(45) Date of Patent: Aug. 17, 2004

(54) RADIO FREQUENCY CLAMPING CIRCUIT

(75) Inventor: Marlin C. Smith, Jr., Cypress, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/385,800

(22) Filed: Mar. 11, 2003

(65) Prior Publication Data

US 2003/0189453 A1 Oct. 9, 2003

(51) Int. Cl.[7] .................................................. H03K 5/08
(52) U.S. Cl. ...................... 327/309; 327/314; 327/320; 327/325
(58) Field of Search ................................ 327/309–312, 327/314, 320, 321–323, 325, 324; 330/298, 207 P; 361/56, 91.1, 91.5, 111, 119

(56) References Cited

U.S. PATENT DOCUMENTS

| | | | | |
|---|---|---|---|---|
| 4,571,511 A | * | 2/1986 | Dischert et al. | 327/312 |
| 4,736,271 A | * | 4/1988 | Mack et al. | 361/56 |
| 5,610,790 A | * | 3/1997 | Staab et al. | 361/56 |
| 6,130,811 A | * | 10/2000 | Gans et al. | 361/56 |
| 6,426,665 B2 | * | 7/2002 | Morishita | 327/310 |
| 6,456,472 B1 | * | 9/2002 | Beriault | 361/56 |
| 6,496,341 B1 | * | 12/2002 | Chen et al. | 361/56 |

* cited by examiner

*Primary Examiner*—Long Nguyen
(74) *Attorney, Agent, or Firm*—Leonard A. Alkov

(57) ABSTRACT

A clamping circuit (10) including an input/output node (12), adapted to be coupled to the protected circuit or component; a first diode (D1) having an anode connected to the input/output node (12); a second diode (D2) having a cathode connected to the input/output node (12); a third diode (D3) connected between the cathode of the first diode (D1) at a first node (14) and the anode of the second diode (D2) at a second node (16); a first arrangement for supplying a first potential at the cathode of the first diode at first node (14); a second arrangement for supplying a second potential at the anode of the second diode at second node (16); a first capacitor (C1) connected between the cathode of the first diode at first node (14) and ground; and a second capacitor connected between the anode of the second diode at second node (16) and ground. In the illustrative embodiment, the anode of the third diode (D3) is connected to the first node (14), the first arrangement includes a first power supply and a first resistor (R1), and the second arrangement includes a second power supply and a second resistor (R2). The illustrative embodiment further includes a third resistor (R3) connected between the first node (14) and ground and a fourth resistor (R4) connected between the second node (16) and ground.

7 Claims, 1 Drawing Sheet

RADIO FREQUENCY CLAMPING CIRCUIT

BACKGROUND OF THE INVENTION

1. Field of the Invention

The present invention relates to clamping circuits. More specifically, the present invention relates to radio frequency clamping circuits.

2. Description of the Related Art

Clamping circuits are used to protect electronic components, circuits and systems against excessive and potentially harmful currents and voltages. In radio frequency systems, for example, clamping circuits have been used to protect analog-to-digital (A/D) converters from over-voltages.

One conventional clamping approach involves the use of switches to isolate the protected circuit or circuit component from a deleterious source of excessively high energy. However, this approach requires a detector and therefore tends to be relatively expensive. In addition, it is difficult to achieve a sufficiently fast response time to provide adequate protection in many cases.

Accordingly, a preferred approach involves the use of diodes to shunt over-voltages to ground. However, the diode approaches known in the art have suffered from linearity problems. That is, these devices have often failed to accurately pass signals below a clamping threshold without degradation.

Accordingly, a need remains in the art for an improved system or method for protecting circuits, components and systems from excessive voltages and currents with good linearity and minimal expense.

SUMMARY OF THE INVENTION

The need in the art is addressed by the clamping circuit of the present invention. The inventive clamping circuit includes an input/output node, adapted to be coupled to a protected circuit or component; a first diode having an anode connected to the input/output node; a second diode having a cathode connected to the input/output node; a third diode connected between the cathode of the first diode and the anode of the second diode; a first arrangement for supplying a first potential at the cathode of the first diode to reverse-bias the first diode, while causing the third diode to go into conduction; a second arrangement for supplying a second potential at the anode of the second diode to reverse-bias the second diode, while causing the third diode to go into conduction; a first capacitor connected between the cathode of the first diode and ground; and a second capacitor connected between the anode of the second diode and ground.

In the illustrative embodiment, the anode of the third diode is connected to the cathode of the first diode, the first arrangement includes a first resistor connected between a first power supply and the cathode of the first diode, and the second arrangement includes a second resistor connected between a second power supply and the anode of the second diode. The illustrative embodiment further includes a third resistor connected between the cathode of the first diode and ground and a fourth resistor connected between the anode of the second diode and ground.

BRIEF DESCRIPTION OF THE DRAWINGS

FIG. 2 shows an alternative embodiment in which the third diode D3 is implemented with two diodes connected in series with a connection to ground at the node there between.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
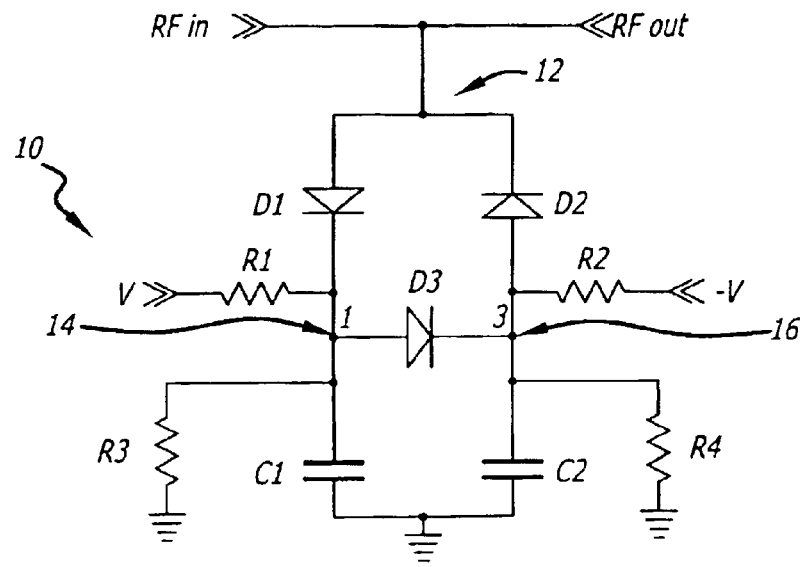
FIG. 1 is a schematic diagram of an illustrative embodiment of a clamping circuit implemented in accordance with the teachings of the present invention.

FIG. 1 is a schematic diagram of an illustrative embodiment of a clamping circuit implemented in accordance with the teachings of the present invention. As shown in FIG. 1, the inventive clamping circuit 10 includes an input/output node 12, adapted to be coupled to a protected circuit or component (not shown). A first diode D1 is included with an anode connected to the input/output node 12. A second diode D2 is included with the cathode thereof connected to the input/output node 12. A third diode D3 is connected between the cathode of the first diode D1 at node 14 and the anode of the second diode D2 at node 16. In the illustrative embodiment, the anode of the third diode D3 is connected to node 14. A first source supplies a first potential at node 14 via a first resistor R1 and a second source supplies a second potential at node 16 via a second resistor R2. A first capacitor C1 is connected between node 14 and ground. A second capacitor C2 is connected between node 16 and ground. The illustrative embodiment further includes a third resistor R3 connected between node 14 and ground and a fourth resistor R4 connected between node 16 and ground. Those of ordinary skill in the art will choose component values for the elements shown based on the requirements of a given application.

In operation, when an RF input signal is applied to the input terminal of a protected device (not shown), the signal is shunted to the input/output node 12 of the clamp 10 of the present invention. If the peak voltage of the input signal is below the clamping threshold, the first and second diodes D1 and D2 are reverse biased by their respective supply voltages and the voltage drop across the third diode D3. This keeps D1 and D2 off and prevents the desired signals from being shunted.

During an overdrive condition, when an RF signal with an over-voltage is present, on the positive cycle, the first diode D1 conducts and places a more-positive voltage at the anode of the third diode. On a negative cycle, the second diode D2 conducts and places a more-negative voltage at the cathode of the third diode D3. In both cases, this causes the third diode D3 to conduct more heavily to limit the change in voltage at the cathode of D1 and at the anode of D2. Those skilled in the art will appreciate that the third diode D3 works with the first and second capacitors C1 and C2 to allow for large over-voltage current to be shunted with a small biasing voltages current.

Figure 2:
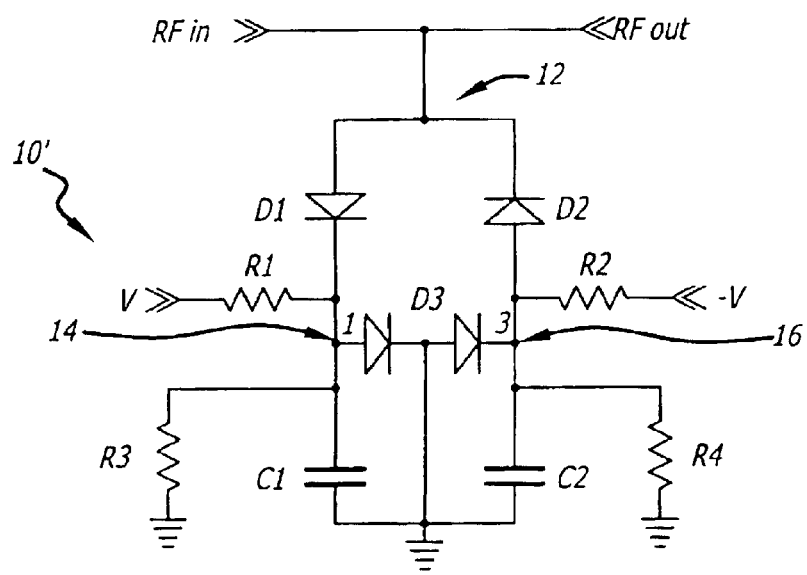

During normal drive levels (below clipping), the circuit 10 provides a high shunt impedance to the RF signal and presents only a small fraction of a dB loss in a typical 50 ohm system. A small biasing current (e.g., 3 ma) flows through the third diode D3 and develops reverse bias for both the first and the second diodes D1 and D2. Because of symmetry, half the voltage drop across D3 becomes the amount of reverse bias for D1 and D2. Using a 1N4148 for D3, approximately 0.3V reverse bias is applied to D1 and D2. The reverse bias voltage value sets the clipping level for the limiter. This value can be altered by changing D3 (to a zener diode for example), or by adding another diode in series with D3 as shown in FIG. 2 below. However, the dynamic impedance of D3 affects the amount that the output level will rise as the input signal level increases past the initial clamp level.

FIG. 2 shows an alternative embodiment in which the third diode D3 is implemented with two diodes connected in series with a connection to ground at the node there between.

In the best mode, D1 and D2 are fast silicon diodes that have low leakage current, and low dynamic impedance when in conduction. The low leakage current provides the high third order intercept point (IP3) for small signal levels. The low dynamic on resistance reduces the increase in power as the input increases.

As mentioned above, when a large signal level is applied, D1 conducts on the positive half cycle, and D2 conducts on the negative half cycle to limit the output voltage swing. During a positive voltage swing, D1 conducts and the voltage at C1 begins to rise. The value of C1 should be chosen to reduce the amount that this voltage can rise during a single half cycle. If D3 were not present, then the rectified RF would slowly charge C1 until only a small amount of average current (equal to the bias current through R1 and R3) would flow through D1. Thus, if D3 were not present, the only way to have optimal limiting would be to use high bias current. With D3 in the circuit, the increase in positive voltage at C1 during the positive half cycle is nullified by the increase in negative voltage at C2 during the negative half cycle, since D3 moves heavily into conduction and effectively connects these points together.

Another alternative embodiment would be for the third diode to be a zener diode to raise the clamping voltage to even higher levels. In this case the third diode connection would be reversed so that conduction occurs due to zener breakdown instead of forward conduction.

In yet another embodiment, a capacitor is placed across the third diode, either as a third capacitor, or as a substitute for the first and second capacitors. In the illustrative application, the inventive clamp protects a device from damage while providing high third order intercept point (IP3) for levels below full scale. In a typical application, the RF output signal from the clamping circuit 10 is applied to the input of a transformer, which in turn differentially drives an analog to digital converter. Thus the RF terminals are at DC ground. In applications where a DC voltage is present, blocking capacitors can be used, with a high value resistor (typical 1K ohm) placed between the input/output node and ground, and with the blocking capacitor between the input/output node and the DC voltage.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A clamping circuit for a circuit to be protected comprising:

an input/output node adapted to be coupled to said protected circuit;

a first diode having an anode connected to said input/output node;

a second diode having a cathode connected to said input/output node;

a third diode connected between the cathode of the said first diode and the anode of the said second diode;

first means for supplying a first potential at the cathode of the said first diode;

second means for supplying a second potential at the anode of said second diode; and a first capacitor connected between the cathode of the said first diode and ground.

2. The invention of claim 1 further including a second capacitor connected between the anode of the said second diode and ground.

3. The invention of claim 1 wherein said first means includes a first power supply and a first resistor.

4. The invention of claim 3 wherein said second means includes a second power supply and a second resistor.

5. The invention of claim 1 further including a resistor connected between the cathode of said first diode and ground.

6. The invention of claim 1 further including a resistor connected between the anode of said second diode and ground.

7. A clamping circuit for a circuit to be protected comprising:

an input/output node adapted to be coupled to said protected circuit;

a first diode having an anode connected to said input/output node;

a second diode having a cathode connected to said input/output node;

a third diode connected between the cathode of said first diode and the anode of said second diode node such that a biasing current causes the third diode to be in conduction while causing the first and second diodes to be reversed biased;

first means for supplying a positive potential at the cathode of said first diode, said first means including a first power supply and a first resistor;

second means for supplying a negative potential at the anode of said second diode, said second means including a second power supply and a second resistor;

a first capacitor connected between the cathode of said first diode and ground;

a second capacitor connected between the anode of said second diode and ground;

a third resistor connected between the cathode of said first diode and ground; and a fourth resistor connected between the anode of said second diode and ground.

* * * * *